Oct. 6, 1964 B. F. GRIB 3,152,269

TUNING FORK RESONATOR MOUNTED TO DAMP EXTERNALLY ORIGINATING MECHANICAL DISTURBANCES

Filed Nov. 24, 1959 2 Sheets-Sheet 1

INVENTOR.
BORIS F. GRIB
BY Darby & Darby
ATTORNEYS

Oct. 6, 1964 B. F. GRIB 3,152,269

TUNING FORK RESONATOR MOUNTED TO DAMP EXTERNALLY ORIGINATING MECHANICAL DISTURBANCES

Filed Nov. 24, 1959 2 Sheets-Sheet 2

INVENTOR.
BORIS F. GRIB
BY Darby & Darby
ATTORNEYS 3,152,269

TUNING FORK RESONATOR MOUNTED TO DAMP EXTERNALLY ORIGINATING MECHANICAL DISTURBANCES

Boris F. Grib, Huntington Station, N.Y., assignor to Philamon Laboratories, Inc., Westbury, N.Y., a corporation of New York Filed Nov. 24, 1959, Ser. No. 855,072
5 Claims. (Cl. 310—25)

The present invention relates to improvements in tuning fork or vibrator resonators, such as are useful in electrical apparatus to give an alternating current output which is particularly stable and free from unwanted frequencies. More particularly the invention relates to such reasonators which are particularly free from external influences of a mechanical nature and thus have a high resistance to shock, vibration, or the like.

This application is a continuation in part of my prior copending application Serial No. 691,615 for Tuning Fork Resonator, filed October 22, 1957, now Patent No. 3,134,035.

Tuning fork resonators are often used as resonant elements for very stable oscillators. Utilizing known practices in this field it is possible to construct oscillators having a frequency stability on the order of 10 parts per million over extensive temperature ranges. However, in addition to temperature changes there are other external influences which adversely affect the frequency stability and performance of such oscillators. Among these other external influences are shock and vibration. The present invention provides means for reducing the effect of externally induced tuning fork vibration on the electrical output of the resonator.

It is accordingly an object of the present invention to provide a tuning fork resonator wherein the effects of vibration of the base on which the resonator is mounted are minimized.

It is a further object of the present invention to provide controlled damping of the vibration of the tuning fork with respect to its housing to give optimum isolation by reason of such damping and also due to the effect of an isolation section forming a part of the tuning fork.

Other objects and advantages will be apparent from a consideration of the following description in conjunction with the appended drawings, in which—

FIG. 2 is a bottom plan view of the resonator and housing of FIG. 1, as mounted on an electrical equipment cabinet, chassis, or the like;

Figure 1:
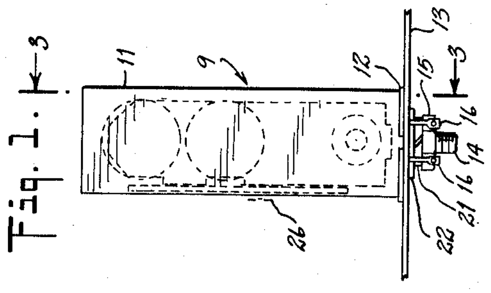
FIG. 1 is a side elevational view of a tuning fork resonator and housing according to the present invention.
Figure 2:
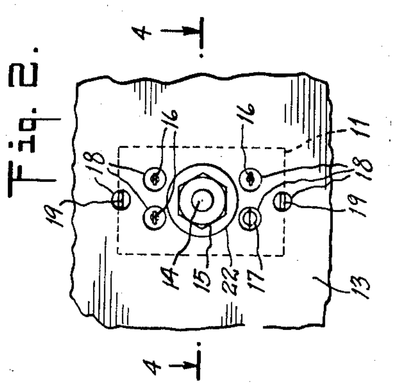

Referring now to FIGS. 1 through 4, a tuning fork resonator 9 is shown having a housing 11. The housing is provided with a base 12 which is secured to a support 13. The support 13 may be an electrical equipment chassis, a bracket, or the like. The tuning fork resonator 9 is shown positioned vertically in FIGS. 1 to 4. It may also be mounted in a horizontal or inverted or other position. She housing base 12 has a bolt or stud 14 attached thereto which passes freely through a hold in the support 13. A nut 15 is provided for the bolt 14 and a washer 21 is provided under the nut 15. A second washer 22 may also be provided under the washer 21. Insulated electrical terminals 16 extend through the housing base 12.

The housing 11 is provided with locator lugs 19 to properly align the housing on the support 13. An evacuation tubulation 17 is provided extending through the base 12 to allow the housing 11 to be evacuated if desired. After assembly of the housing 11 any openings may be sealed by soldering or otherwise, after which the interior of the housing may be evacuated by exhausting the air through the tubulation 17 and pinching it off. Evacuating interior of the housing provides an advantage in that the damping effect of the air upon the fork tines is eliminated and frequently changes due to air temperature and density variations are also eliminated. Holes 18 are provided in the support 13 for the electrical leads 16, the locator lugs 19 and the evacuation tubulation 17.

A frame 24 is provided within the housing upon which the various resonator elements are mounted. The frame 24 has a flat base section 6 and sides 8 extending at right angles thereto. A strap 28 extends between the edges of sides 8 parallel to base 6 of the frame, and struts 7 are provided between the sides 8, at their opposite edges, all of which tend to strengthen the frame 24.

The base 6, sides 8 and cross-strap 28 of the frame may conveniently be formed from a single sheet of metal. The frame is preferably formed of magnetic material to provide a low reluctance magnetic circuit for magnetic flux from the permanent magnets and coils which are mounted on the frame.

A screw 26 fastens the frame 24 within the housing 11. The frame 24 may be supported within the housing 11 by means of rubber bumpers 25. If desired, the frame 24 may be supported solely by the screw 26 eliminating the bumpers 25.

The housing 11 is mounted on chassis 13 in contact with a pad 27, which may be of rubber or other compressible material, and by means of the single bolt 14 together with nut 15 and washers 21 and 22. Washer 21 may be a lock type washer so that nut 15 will be retained set to the desired pressure, or other nut locking means may be use.

Figure 3:
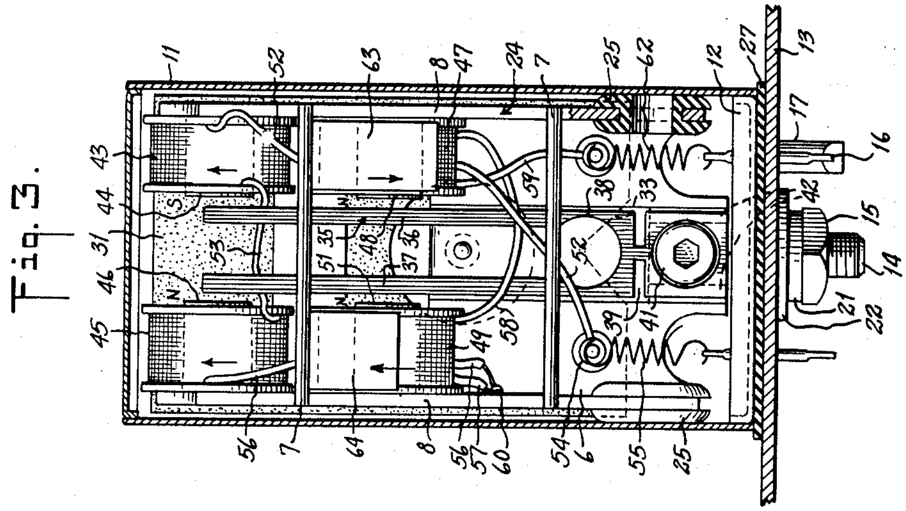
FIG. 3 is a vertical cross-sectional view of the tuning fork resonator taken along the line 3—3 in FIG. 1.

The frame 24 is mounted in the housing 11 by means of a vibration damping mounting. Between the frame 24 and the housing 11 there is placed a pad 31 having a hole 32 coaxial with the mounting screw 26 and substantially larger than the mounting screw 26 to provide freedom of movement of the frame 24. The pads 27–31 may be made of rubber, fabric, felt or any suitable material, but preferably a material adapted to provide substantial sliding friction. A rubber-like product with the name "Silastic" may be used to advantage. A notch 33 may be cut in the pad 31 as shown in FIG. 3 so that a compression spring or springs 34 may be mounted on the frame 24 between the frame and the wall of the housing 11. The spring 34 allows the pressure of the frame 24 on the pad 31 to be adjusted to the optimum value.

The spring 34 also tends to press the outer section 28 of the frame 24 against the resilient pad 31 by pivotal section about screw 26. It will be noted that the outer section of the frame 24 is more inclined to vibrate and also that vibration of this portion of the frame 24 is likely to be more detrimental to the tuning fork resonator. If desired the spring 34 may be omitted and the force with which the frame 24 bears against the resilient pad 31 may be controlled only by adjusting the screw 26 to compress the resilient pad 31 to the necessary extent to provide the desired force. Alternatively, a bowed leaf spring, apertured to fit loosely about screw 26, may be inserted between pad 31 and frame outer section 28.

Figure 4:
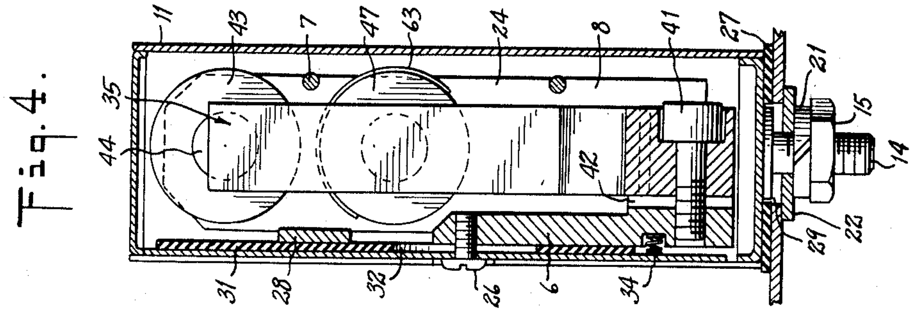
FIG. 4 is a vertical cross-sectional view of the tuning fork resonator taken along the line 4—4 in FIGS. 2 and 3.

Although the pad 31 in FIG. 4 is formed in the shape of a rectangular sheet having a hole in the center thereof, the pad may also be formed in other shapes. Substantially the same result may be achieved by the use of three feet or small pads of rubber or other suitable frictional material placed between the frame base 6 and the housing 11 in the position occupied by the pad 13 shown in FIGS. 3 and 4.

The frame 24 and the housing 11 separated by the pad 31 are allowed sufficient freedom of relative movement so that any vibration of the frame 24 (such as caused by shock or high acceleration) is rapidly damped due to the absorption of energy in the sliding movement of frame 24 against pad 31. The pad 31 is preferably secured in the housing 11 for example by gluing, in order to facilitate the assembly of the resonator. Sliding movement therefore takes place between the frame 24 and the pad 31. It will be obvious however that the pad could be fastened to the frame 24 rather than the housing 11 or in some applications need not be fastened to either one.

The tuning fork 35 (best shown in FIG. 3) has two tines 36 and 37 and has a circular opening 38 at the base of the tines so that the tines are narrow at their base and vibrate readily. The tuning fork is provided with a slot 39 for isolating external vibration in accordance with the teachings of U.S. patent application No. 415,318 of Boris F. Grib, filed March 10, 1954, and issued as U.S. Patent No. 2,806,400 on September 17, 1957. It will be understood of course that other types of tuning forks might be employed in a resonator according to the present invention or in fact a reed or other vibratory element might be used. The tuning fork 35 may be secured to the frame 24 by means of a bolt 41. The frame 24 may be supplied with rails 42 which are ground to provide two flat edges so that the fork 35 is firmly supported to prevent wobbling or other movement which might occur if it were secured against a surface having slight irregularities.

A coil 43 is provided adjacent tine 36 of the tuning fork. In the particular embodiment shown in FIG. 3 the coil 43 is a drive coil which supplies the necessary energy to maintain the vibration of tuning fork 35. Coil 43 is wound about a permanent magnet 44. In the device shown in FIG. 3 the south pole of the permanent magnet 44 is placed adjacent the tine 36 of the tuning fork 35. The current supply to the drive coil 43 is an alternating current which produces a flux which reverses in direction during each cycle of alternating current. The magnet 44 however provides a bias flux and thus the flux generated by the coil 43 adds to or subtracts from the bias flux created by the permanent magnet 44 depending upon the momentary direction of flow of the current in the coil 43. The total flux produced at coil 43 is therefore always in the same direction but fluctuates from a maximum when the coil flux is added to the magnet flux to a minimum when the coil flux us opposing the magnet flux. A complete cycle from maximum to minimum and back again occurs for every cycle of the current supply to coil 43. A second drive coil 45 is provided adjacent tine 37 of tuning fork 35. The coil 45 is wound about a permanent magnet core 46 in a manner similar to that previously described.

As is well known the tines of a tuning fork normally vibrate symmetrically with respect to the tuning fork axis, that is, both tines of the tuning fork are moving away from the tuning fork axis during one-half of the vibration cycle and conversely both are moving toward the tuning fork axis during the other half of the cycle. Therefore, in order for the coils 43 and 45 to operate to drive the tines in coordination they must exert the maximum outward force or attraction for the tines at the same time. This means that each coil with its magnet core must produce the maximum magnetic flux at the same time as the other does. However, so far as the tines are concerned, the polarity of the drive coil flux does not matter. Hence there are two ways in which the drive coils with their magnet cores may be mounted, i.e., symmetrically or non-symmetrically with respect to the fork axis. In the present case, for a particular purpose described below, the drive coils 43, 45 are mounted symmetrically, but are wound asymmetrically with reference to the fork axis, i.e., they are wound in the same sense to produce magneto-motive forces extending in the same direction at each instant. Since the coils 43 and 45 are wound asymmetrically, the polarities of the magnets 43 and 46 must likewise be asymmetrical to provide coordinated driving of the tines 36 and 37. It will be noted that this asymmetrical magnet polarity is provided by locating the north pole of magnet 46 facing inward and adjacent tine 37 of the tuning fork 35, while the south pole of magnet 44 faces its adjacent tine 36. In this way, both coils pull simultaneously on their respective tines, and in phase with one another.

A pickup coil 47 is provided adjacent tine 36 of tuning fork 35 for sensing and responding to the vibration of tine 36 of the tuning fork. Magnetic flux for the pickup coil 47 is provided by a permanent magnet 48 about which the coil 47 is wound. As tine 36 of the tuning fork 45 vibrates the air gap between tine 36 and the magnet 48 is varied thus varying the reluctance of the magnetic circuit and causing a change in the flux within the coil 47. This change of flux generates an electromotive force within the coil 47 which corresponds to the vibration of tine 36 of tuning fork 35. A similar pickup coil 49 and magnet 51 is placed symmetrically adjacent tine 37 of the tuning fork.

It will be noted that the polarities of the magnets 48 and 51 are symmetrical with respect to the axis of the tuning fork, that is, each magnet is orientated with the north pole pointing inward. The induced E.M.F. in the windings of coils 47 and 49 will therefore be symmetrical as a result of normal symmetrical vibration of the tuning fork tines 36 and 37. The direction of induced current is indicated by the arrows on coils 47 and 49. The coils 47 and 49 are connected so that their respective E.M.F's are additive.

The pickup coils and the drive coils in FIG. 3 are respectively connected in series although they could be connected in parallel if desired. Coil 43 has one end connected by means of lead 52 to insulated drive terminal 54 on frame 24. Drive terminal 54 is connected by a flexible electrical connector 55 to lead 16. The other end of coil 43 is connected by means of lead 53 to one end of coil 45. The other end of coil 45 is connected by means of lead 56 to frame 24 at 60 which constitutes an electrical ground. Coils 43 and 45 are thus connected in series between one external terminal 16 and ground. Coils 47 and 49 are similarly connected in series between the other insulated terminal 16 in FIG. 3 and the grounded frame 24 by means of flexible connector 62, pickup terminal 61 and leads 59, 58 and 57. Pickup coils 47 and 49 are thus connected in series in such a way that the E.M.F.'s in the coils 47 and 49 are additive. The series-connected drive coils 43 and 45 and the series-connected pickup coils 47 and 49 are each connected to the resonator frame and are thus grounded at one terminal. This is done only as a matter of convenience; obviously separate external terminals could be provided for the leads 56 and 57 if desired.

From the foregoing description it will be seen that the pickup coils 47 and 49 wth their magnetic cores are arranged so that symmetrical vibration of the tines 36 and 37 generates additive electromotive forces in the respective pickup coils and thus tends to produce a higher output. On the other hand vibration of the tuning fork as a unit, that is in reed fashion, with both tines moving in the same direction, creates opposing electromotive forces in the respective pickup coils 47 and 49 and thus this reed type of vibration creates no resultant signal in the balanced pickup arrangement shown in FIG. 3. While it is rare for a fork to have pure reed vibration, any deviation from pure symmetrical vibration may be considered to be and has the same effect as a reed vibration superposed on a symmetrical vibration, and the balanced arrangement described suppresses the effects of the reed vibration component. This balanced pickup arrangement is particularly desirable when a tuning fork having an isolation section 39 is used since this section tends to allow substantial reed type vibration. At the same time the isolation section 39 tends to reduce the effect of external shock and vibration upon the normal symmetrical mode of vibration of the tuning fork. Thus when the vibration in the reed mode is eliminated by the balanced pickup coil arrangement an exceptionally stable and well isolated resonator arrangement is provided.

Previous pickup arrangements for tuning forks or the like have been subject to a great deal of direct magnetic coupling between the pickup coils and the drive coils. Direct magnetic coupling between the input and the output of the resonator is highly undesirable. This magnetic coupling causes the resonator to act as if it were shunted by a transformer which passes a wide range of frequencies. Considering the resonator element as a filter, it will be observed that although it is intended that the resonator convey signals from its input to its output with a high degree of selectivity. The magnetic coupling allows signals of all frequencies to pass through with substantial amplitude. The degree of frequency selectivity of the resonator is therefore greatly degraded due to the fact that all frequencies are passed to a substantial extent by the transformer or coupling effect between input and output coils. Magnetic coupling naturally results when pickup coils and drive coils are placed in close proximity unless a great deal of magnetic shielding is employed. It is obviously undesirable to separate the pickup and drive coils since this would require the resonator device to be much larger, and it is similarly undesirable to provide excessive magnetic shielding as this would make the device heavier and of more complicated construction.

Various arrangements of coils are provided in the present invention, one of which is illustratively shown in FIG. 3 making possible the virtual elimination of direct magnetic coupling by the cancellation of voltages induced by magnetic coupling. In FIG. 3 for example, it will be noted that the currents in coils 43 and 45 are in the same sense, as indicated by the arrows on these coils. The coils 47 and 49 however are connected in the opposite sense as indicated by the arrows thereon. The electromotive force induced in coil 47 due to the inductive effect of the drive current in coil 43 is therefore of an opposite sense to the similar electromotive force induced in coil 49 by the drive current in coil 45. If these electromotive forces are equal they will completely cancel and thus eliminate the effect of any magnetic coupling between the drive coils 43 and 45 and the pickup coils 47 and 49.

Metal shields 63 and 64 are provided for coils 47 and 49 respectively. The shield 43 may be of semi-cylindrical shape to fit over the coils 47 and 49. The shields 63 and 64 may be moved around the periphery of their respective coils in order to vary the shielding between the respective pickup coil and the adjacent drive coil. The shields 63 and 64 therefore not only reduce the magnetic coupling to some extent but also perform a more important function in that they allow the amounts of electromagnetic coupling of the two pickup coils 47 and 49 to be individually adjusted so that the magnetic coupling for the two coils are equal and thus the total magnetic coupling effect is completely cancelled. Although the semi-cylindrical magnetic shields 63 and 64 provide a particularly simple and effective adjustable magnetic coupling arrangement, any other suitable means could be used for adjusting the magnetic coupling between the respective pickup coils and drive coils. For example, the coils could be made slidable to adjust the spacing between drive and pickup coils.

It will be noted in FIG. 3 that to obtain the desired relationships between the various coil windings a non-symmetrical arrangement of magnetic poles is provided for the magnets 44, 46, 48 and 51. Therefore if all the magnets were of equal strength there might be some difference in flux density in the magnetic circuits on either side of the tuning fork. This situation may readily be remedied by partially demagnetizing particular ones of the magnets (this may be accomplished simply by passing an alternating current through the coil around the particular magnet). In the particular arrangement shown in FIG. 3, for example, it has been found desirable to substantially demagnetize magnet 46 and to demagnetize magnet 48 to some extent. By this expedient it is possible to maintain substantially complete balance between the coils on the opposite sides of the tuning fork 35. Adjustment of the balance between the coils on opposite sides of the tuning fork 35 may be accomplished by pivoting the tuning fork about its mounting nut 41 so that the tines of the fork are properly spaced between the magnet poles on the two sides of the fork. Obviously diminishing the air gap at a particular coil strengthens the magnetic flux through the coil and increases its effectiveness, and conversely. By this means still further balance of the coils on opposite sides of the tuning fork 35 may be obtained. As has been previously explained the total magnetic coupling between drive and pickup coils can be eliminated by properly adjusting the shields 63 and 64 to balance the magnetic coupling effects in coils 47 and 49.

The particular arrangement of windings of magnetic polarity shown in FIG. 3 is not the only arrangement which may be utilized to produce the desired balancing effect. Any arrangement will be satisfactory where the poles of the drive or pickup coils are symmetrically arranged with respect to the tuning fork axis while the poles of the other pair of magnets are asymmetrically arranged, and in which either the pickup or drive coils are wound in the same sense while the other pair of coils are wound in the opposite sense. Any such arrangement will result in the magnetic coupling to the respective pickup coils being in opposition so that proper adjustment of the coupling will allow the magnetic coupling to be virtually eliminated.

Figure 5:
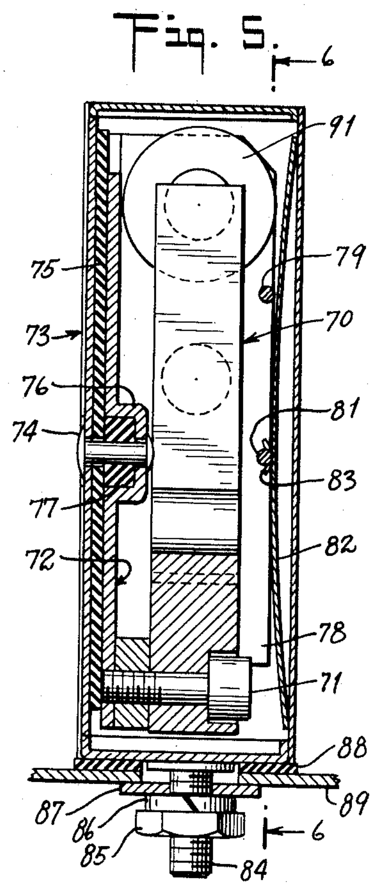
FIGS. 5, 6 and 7 are side front and top sectional views of an alternative form of the invention incorporating a somewhat different mounting.
Figure 6:
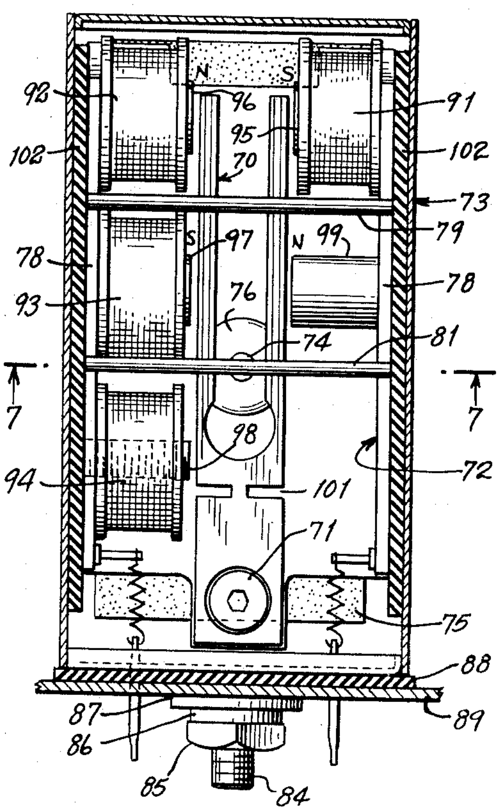
Figure 7:
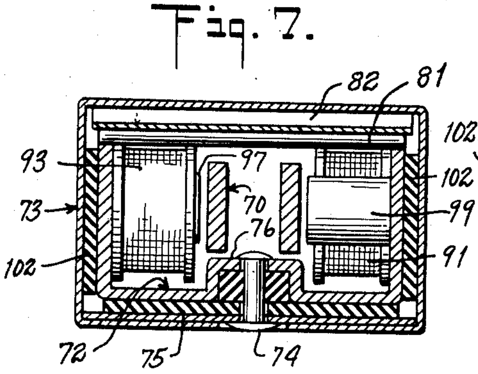

FIGURES 5, 6 and 7 show an alternative form of tuning fork resonator having a somewhat different mounting arrangement. The tuning fork 70 is mounted to a frame 72 by means of a bolt 71 as in FIGS. 1–4. The frame 72 is located within a housing 73 in which it is attached by means of a rivet 74 or other suitable fastener. A resilient pad 75 is situated between the frame 72 and the wall of the housing 73. The resilient pad 75 may be formed of natural or synthetic rubber or other suitable material. Rubber is preferred for the pad 75 as it has a resilience which imparts a desirable degree of damping between the frame 72 and the housing 73 as will later be explained.

A depression 76 is provided in the frame 72 to accommodate a resilient washer 77 which may also be formed of rubber. The washer 77 tends to prevent the rivet 74 from vibrating or chattering against the side of the hole in the depression 76 when the housing and its contents are subjected to vibration.

The frame 72 has side walls 78 and is reinforced by bars 79 and 81 extending across the frame between the side walls 78. The pad 75 is compressed between the wall of the housing 73 and the frame 72 by means of a leaf spring 82 which bears against bar 81 and is held in place by a guide member 83 which may be formed of a short length of wire soldered to the leaf spring 82 or in any other suitable fashion. It will be observed therefore that the compression of the pad 75 is controlled in FIGS. 5 and 7 largely by the pressure exerted by the leaf spring 82. That is, the rivet 74 is not drawn down tight enough to cause pressure on the pad 75 exceeding that exerted by the leaf spring 82. If desired, however, the pressure on the pad 75 may be controlled by the tightness of the rivet 74 or other fastener such as a bolt or machine screw used in the place of rivet 74.

The housing 73 has a bolt 84 secured thereto in any suitable fashion for fastening the housing 73 and its contents to an electrical equipment chassis or other mounting location. A nut 85, lock washer 86 and flat washer 87 may be utilized to secure the housing 73 to a base 89 such as in an electrical equipment chassis. A resilient pad 88 may be inserted between the housing 73 and the plate 89 but this pad is in no respect essential, and in fact the attachment of the housing 73 to a base plate 89 may be achieved in any suitable fashion other than the particular one shown in FIGS. 1–7.

The arrangement of the various coils in the tuning fork resonator of FIGS. 5 through 7 is somewhat different that that of FIGS. 1–4, but operates generally on the same principles.

Coils 91 and 92 in FIG. 6 for example are pickup coils which are balanced on either side of the tuning fork and connected in series to maximize the pickup of the vibration on the tuning fork in its symmetrical mode and to minimize electrical pickup of the reed mode vibration of the tuning fork as previously explained.

Coil 93 is a drive coil for the tuning fork 70. Only one drive coil is utilized in the embodiment of FIGS. 5–7, but obviously another drive coil might be added on the opposite side of the tuning fork or elsewhere if desired.

Coil 94 is a bucking coil which is connected in series with pickup coils 91 and 92 and is designed to counteract any inductive coupling between coils 93 and 92 and also the lesser coupling between coils 93 and 91 which might also exist.

Permanent magnets 95 and 96 form the core of coils 91 and 92 respectively and are polarized with a south pole facing inwardly for magnet 95 and a north pole facing inward for magnet 96. These magnets tend to produce an additive magneto-motive effect in the magnetic circuit comprising the tuning fork 70 and the frame 72. A permanent magnet 97 also forms the core of coil 93. This permanent magnet is polarized with a south pole facing inward as indicated in FIG. 6 so that this magnet and magnet 96 also produce an additive magneto-motive effect. A permanent magnet 99 is placed opposite magnet 97 and polarized with a north pole facing inward to better complete the magnetic circuit for drive coil 93 and to increase the efficacy of this coil.

Coil 94 is provided with a core 98 which may be of soft iron or other magnetic material. The core 98 is threaded so that it may be adjusted to increase or decrease the gap between it and the tuning fork 70 thus adjusting the inductive coupling between coil 94 and coil 93. The inductive coupling between these two coils may thus be adjusted to exactly counteract the inductive coupling between drive coil 93 and pickup coils 91 and 92. Obviously coil 94 will be connected in an opposite sense so that the inductive coupling effect is opposite to that in coils 91 and 92. Although coils 91, 92 and 94 are connected in series in the usual case, one or more of these coils may be connected in parallel if desired.

The electrical connections for coils 91–94 have been omitted in FIG. 6 for simplicity as they are shown in previous FIGS. 1–4.

Preferably an isolation slot 101 is provided in the tuning fork 70 to provide isolation of the tuning fork tines from external shock and vibration as explained in U.S. Patent No. 2,806,400.

Bumpers 102 may be provided within housing 73 to prevent excessive rotation of the frame 72 about the pivot point represented by the rivet 74 which might result in the frame 72 coming into contact with the walls of the housing 73.

Figure 8:
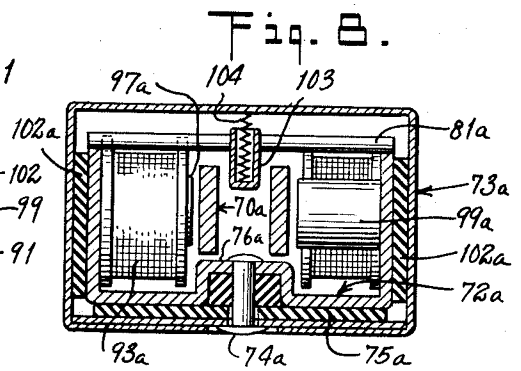
FIG. 8 is a top sectional view of a still further alternative form of device having a still different mounting arrangement.

FIG. 8 shows an alternative form of mounting which is similar to that of FIGS. 5–7 except that the leaf spring 82 is replaced by a coil compression spring 104.

The spring 104 is retained in place by a cup 103 which may be soldered or otherwise secured to the bar 81*a*. It will be observed that the device of FIG. 8 is otherwise similar to that of FIGS. 5–7 and corresponding parts have been given the same reference numerals except for the addition of a suffix letter *a*. If desired, the device of FIG. 8 may be arranged with the bar 81*a* moved somewhat forward or rearward so that the spring 104 and cup 103 may be directly above the rivet 74*a*.

Although the use of rubber pads to provide isolation of some degree against shock and vibration is well known, the arrangements utilized for mounting the tuning fork shown and described hereinabove provides particular advantages which are not immediately obvious. The operation of the mounting can best be explained by first considering an arrangement in which the frame together with the tuning fork mounted thereon is supported with complete frictionless rotational freedom about a single point near the center gravity of the frame and tuning fork and near the base of the tuning fork tines. Taking FIG. 5 as an example the pivot point would be the rivet 74, the frame would be frame 72 and the tuning fork 70. With such an arrangement the "Q" of the frame and tuning fork with respect to the housing 73 would be virtually zero, since vibration of the tuning forks 70 with respect to the housing 73 would have no restraining force to support it and would be dissipated virtually immediately.

The "Q" factor is a measure of the energy stored relative to the energy dissipated in an oscillating system, and is useful in analysis of mechanical vibration problems as well as in electrical circuit problems where it is quite widely used.

A frictional support would therefore appear to give highly desirable isolation of the tuning fork 70 from vibration imparted through the housing 73; however, it has been discovered that some reed vibration is a not undesirable concomitant of the isolation slot 101 provided in the tuning fork for isolation of the tines from external vibration. If a frictionless connection were provided by rivet 74, the desired effect of the isolation slot 101 would be substantially eliminated. Accordingly it is desirable to provide some frictional damping between the frame 72 and the housing 73 so that the advantages of the isolation slot 101 are not lost, but at the same time, the advantage of a central connection of the frame 72 with substantial freedom of rotational movement is also obtained.

The desired amount of damping between the frame 72 and the housing 73 has been found to be approximately that which provides an effective "Q" for vibration of the frame with respect to the housing of 10. In the arrangement of FIGS. 5–7 for example this is provided by a rubber pad of approximately 1/16" thickness under a compression provided by leaf spring 82 of approximately 2 pounds. Obviously with variations in the thickness of the pad 75 and variations in the weight of tuning fork 70 and frame 72 changes may be desired in the amount of pressure exerted by leaf spring 82.

The mounting can also be constructed by cementing the pad to both the frame and housing, in which case means for compressing the pad between frame and housing may be omitted.

From the foregoing explanation it will be observed that tuning forks mounted as shown and described are isolated from vibration by means of their pivotal mounting near the center of gravity thereof and that sufficient damping is provided between the frame supporting the tuning fork and the housing to which it is attached so that the advantages accruing from the isolation slot 101 are preserved.

From the foregoing explanation it will be obvious that in addition to the modifications and variations shown and suggested that various other modifications will be obvious to those skilled in the art, and accordingly it is desired that the scope of the invention shall not be limited to the particular variations shown or suggested but rather that it will be limited solely by the appended claims.

What is claimed is:

1. In a tuning fork resonator including a tuning fork having an isolation slot in the shank thereof, means for driving said fork and pickup means for detecting the oscillation of said fork; mounting means comprising a frame rigidly attached to said fork shank, a housing for said resonator, a pivotal connection between said frame and said housing with an axis perpendicular to the plane of vibration of said fork and extending substantially through the center of gravity of said fork and frame and substantially through the base area of the tines of said fork, damping means comprising a resilient pad between said frame and said housing retarding relative rotational movement therebetween, and a spring arranged between said frame and said housing along the axis of said pivotal connection for compressing said pad between said housing and said frame to control the resilience of said mounting to optimize the total isolation of said fork tines at the frequency of oscillation of said fork.

2. A tuning fork resonator including a tuning fork having an isolation slot in the shank thereof, means for driving said fork and pickup means for detecting the oscillation of said fork; mounting means comprising a frame rigidly attached to said fork shank, a housing for said resonator, means connecting said frame to said housing with substantial rotational freedom about an axis perpendicular to the plane of vibration of said fork and extending substantially through the center of gravity of said fork and frame and substantially through the base area of the tines of said fork, and damping means comprising a resilient pad between said frame and said housing retarding relative rotational movement therebetween, and means for compressing said pad between said housing and said frame to control the resilience of said mounting to optimize the total isolation of said fork tines at the frequency of oscillation of said fork.

3. In a tuning fork resonator including a tuning fork having an isolation slot in the shank thereof, means for driving said fork and pickup means for detecting the oscillation of said fork; mounting means comprising a frame rigidly attached to said fork shank, a housing for said resonator, means connecting said frame to said housing with substantial rotational freedom about an axis perpendicular to the plane of vibration of said fork and extending substantially through the center of gravity of said fork and frame, damping means comprising a resilient pad between said frame and said housing retarding relative rotational movement therebetween.

4. In a tuning fork resonator including a tuning fork having an isolation slot in the shank thereof, means for driving said fork and pickup means for detecting the oscillation of said fork; mounting means comprising a frame rigidly attached to said fork shank, a housing for said resonator, means connecting said frame to said housing with substantial rotational freedom about an axis perpendicular to the plane of vibration of said fork and extending substantially through the base area of the tines of said fork, and damping means between said frame and said housing retarding relative rotational movement therebetween.

5. In a tuning fork resonator including a tuning fork having an isolation slot in the shank thereof, means for driving said fork and pickup means for detecting the oscillation of said fork: mounting means comprising a frame rigidly attached to said fork shank, a housing for said resonator, means connecting said frame to said housing with substantial rotational freedom about an axis perpendicular to the plane of vibration of said fork and extending substantially through the center of gravity of said fork and frame and damping means between said frame and said housing retarding relative rotational movement therebetween.

References Cited in the file of this patent

UNITED STATES PATENTS

| | | |
|---|---|---|
| 1,524,868 | Knoll | Feb. 3, 1925 |
| 2,707,234 | Dostal | Apr. 26, 1955 |
| 2,777,950 | Doremus | Jan. 15, 1957 |
| 2,247,960 | Michaels | July 1, 1960 |
| 2,971,104 | Holt | Feb. 7, 1961 |

OTHER REFERENCES

Pender, McLlwain, Electrical Engineers Handbook, 3rd edition, pages 3–46; John Wiley and Sons, New York, 1936.